(12) United States Patent
Lu et al.

(10) Patent No.: US 11,728,352 B2
(45) Date of Patent: Aug. 15, 2023

(54) DRIVING SUBSTRATE AND MANUFACTURING METHOD THEREOF AND DISPLAY DEVICE

(71) Applicant: BOE TECHNOLOGY GROUP CO., LTD., Beijing (CN)

(72) Inventors: Xinhong Lu, Beijing (CN); Fangzhen Zhang, Beijing (CN); Guangcai Yuan, Beijing (CN); Zhanfeng Cao, Beijing (CN); Jiushi Wang, Beijing (CN); Ke Wang, Beijing (CN); Xiaoyan Zhu, Beijing (CN); Qi Qi, Beijing (CN); Jingshang Zhou, Beijing (CN); Zhaohui Qiang, Beijing (CN); Zhiwei Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 144 days.

(21) Appl. No.: 17/354,007

(22) Filed: Jun. 22, 2021

(65) Prior Publication Data
US 2022/0028898 A1    Jan. 27, 2022

(30) Foreign Application Priority Data
Jul. 27, 2020    (CN) .......................... 202010733605.7

(51) Int. Cl.
*H01L 27/12*    (2006.01)
*H01L 25/16*    (2023.01)

(52) U.S. Cl.
CPC .......... *H01L 27/124* (2013.01); *H01L 25/167* (2013.01); *H01L 27/1248* (2013.01); *H01L 27/1259* (2013.01); *H01L 27/1218* (2013.01)

(58) Field of Classification Search
None
See application file for complete search history.

(56) References Cited

U.S. PATENT DOCUMENTS

| | | | |
|---|---|---|---|
| 2017/0288008 A1* | 10/2017 | Kim | G09G 3/3258 |
| 2020/0176540 A1* | 6/2020 | Park | H01L 27/3258 |
| 2021/0378107 A1* | 12/2021 | Hwang | H05K 5/0017 |
| 2022/0115625 A1* | 4/2022 | Yu | H01L 27/3276 |
| 2022/0406875 A1* | 12/2022 | Zhang | H01L 27/3262 |

FOREIGN PATENT DOCUMENTS

| | | |
|---|---|---|
| CN | 111524927 A | 8/2020 |
| CN | 113363264 A | 9/2021 |

* cited by examiner

*Primary Examiner* — Bo B Jang
(74) *Attorney, Agent, or Firm* — Houtteman Law LLC

(57) ABSTRACT

The present disclosure provides a driving substrate including: a flexible substrate base, a plurality of thin film transistors on the flexible substrate base and a first conductive pattern layer on a side of the thin film transistors distal to the flexible substrate base. The first conductive pattern layer includes: a plurality of first connection terminals in the display region and a plurality of signal supply lines in the bendable region. A first number of first connection terminals are electrically coupled to first electrodes of the plurality of thin film transistors. The plurality of signal supply lines are coupled to a second number of first connection terminals other than the first number of first connection terminals. At least one inorganic insulating layer including a hollowed-out pattern in the bendable region is between the first conductive pattern layer and the flexible substrate base.

18 Claims, 10 Drawing Sheets

DRIVING SUBSTRATE AND MANUFACTURING METHOD THEREOF AND DISPLAY DEVICE

CROSS-REFERENCE TO RELATED APPLICATIONS

The present application claims the priority of the Chinese Patent Application No. 202010733605.7, filed on Jul. 27, 2020 at the Chinese Intellectual Property Office, the content of which is incorporated herein by reference in its entirety.

TECHNICAL FIELD

The present disclosure relates to the field of display technology, and in particular, to a driving substrate and a manufacturing method thereof, and a display device.

BACKGROUND

Micro/Mini light emitting diode (Micro/Mini-LED) display technology as new display technology has the advantages of high brightness, excellent light emitting efficiency, low power consumption, and the like. Micro/Mini-LED chips are typically transferred onto a display substrate by transfer technology. Since a large-size LED display substrate cannot be directly manufactured due to the limitation of the transfer technology, a plurality of small-size LED display substrates are spliced to form a large-size LED display substrate in a splicing manner in the related art. During the splicing process, in order to reduce gaps between the small-sized LED display substrates, peripheries of the small-sized LED display substrates are often bent firstly to make bonding regions of the small-sized LED display substrates on a back side, and then the small-sized LED display substrates are spliced and fixed.

Currently, active matrix driving is an indispensable choice for realizing high-quality image. In the related art, two driving modes, namely a direct driving mode (uIC) by a driving chip and a driving mode by thin film transistors (TFTs), are generally adopted to realize the active matrix driving.

SUMMARY

According to one aspect of the present disclosure, a driving substrate is provided. The driving substrate includes: a flexible substrate base, a plurality of thin film transistors on the flexible substrate base and a first conductive pattern layer on a side of the plurality of thin film transistors distal to the flexible substrate base; wherein the flexible substrate base includes: a display region, a bendable region and a bonding region, the bendable region is between the display region and the bonding region, and the plurality of thin film transistors are in the display region; the first conductive pattern layer includes: a plurality of first connection terminals and a plurality of signal supply lines, the plurality of first connection terminals are in the display region, a first number of first connection terminals of the plurality of first connection terminals are electrically coupled to first electrodes of the plurality of thin film transistors respectively, the plurality of signal supply lines are in the bendable region, two ends of each of the plurality of signal supply lines extend into the display region and the bonding region respectively, and the plurality of signal supply lines are electrically coupled to a second number of first connection terminals other than the first number of first connection terminals of the plurality of first connection terminals in the display region; and at least one inorganic insulating layer is between the first conductive pattern layer and the flexible substrate base, and the at least one inorganic insulating layer includes a hollowed-out pattern in the bendable region.

In some embodiments, a portion of the at least one inorganic insulating layer in the bendable region has a thickness in a range from 0 Å to 2000 Å in a direction perpendicular to the flexible substrate base.

In some embodiments, the driving substrate further includes an isolation barrier layer between the flexible substrate base and the plurality of thin film transistors, wherein a portion of the isolation barrier layer in the display region has a thickness larger than a portion of the isolation barrier layer in the bendable region, and the at least one inorganic insulating layer includes the isolation barrier layer.

In some embodiments, the portion of the isolation barrier layer in the display region has a thickness in a range from 6500 Å to 9500 Å; a portion of the isolation barrier layer in the bendable region and overlapping with the plurality of signal supply lines in a direction perpendicular to the flexible substrate base has a thickness in a range from 1000 Å to 2000 Å; and a portion of the isolation barrier layer in the bendable region and not overlapping with the plurality of signal supply lines in the direction perpendicular to the flexible substrate base has a thickness of zero.

In some embodiments, the first conductive pattern layer further includes: a plurality of second connection terminals in the bonding region, and the plurality of second connection terminals are electrically coupled to the plurality of signal supply lines, respectively.

In some embodiments, the driving substrate further includes a first planarization layer on a side of the first conductive pattern layer distal to the flexible substrate base; wherein a plurality of first vias respectively extending to the plurality of first connection terminals are provided in the first planarization layer at positions corresponding to the plurality of first connection terminals in the direction perpendicular to the flexible substrate base; and a plurality of second vias respectively extending to the plurality of second connection terminals are provided in the first planarization layer at positions corresponding to the plurality of second connection terminals in the direction perpendicular to the flexible substrate base.

In some embodiments, each of the plurality of thin film transistors includes an active layer, a first gate, a first electrode and a second electrode; the driving substrate further includes a gate insulating layer between the active layer and the first gate in the direction perpendicular to the flexible substrate base, and an interlayer dielectric layer between the first and second electrodes and the active layer, the first and second electrodes are coupled to the active layer through vias in the interlayer dielectric layer, respectively; and the at least one inorganic insulating layer includes the isolation barrier layer, the gate insulating layer and the interlayer dielectric layer.

In some embodiments, each of the plurality of thin film transistors further includes a second gate; the second gate is on a side of the active layer proximal to the flexible substrate base, and a buffer layer is formed between the second gate and the active layer; the first gate is on a side of the active layer distal to the flexible substrate base, the first and second electrodes are on a side of the first gate distal to the flexible substrate base, and the first gate is electrically coupled to the second gate; and the at least one inorganic insulating layer further includes the buffer layer.

In some embodiments, the driving substrate further includes a second conductive pattern layer between the first conductive pattern layer and the plurality of thin film transistors; wherein the second conductive pattern layer includes: a plurality of signal transmission lines, through which the second number of first connection terminals other than the first number of first connection terminals of the plurality of first connection terminals are electrically coupled to corresponding signal supply lines of the plurality of signal supply lines, respectively.

In some embodiments, the second conductive pattern layer is in a same layer as the first and second electrodes.

In some embodiments, the driving substrate further includes a second planarization layer on a side of the second conductive pattern layer distal to the flexible substrate base, and a first passivation layer on a side of the second planarization layer distal to the flexible substrate base, wherein the second planarization layer includes a hollowed-out pattern in the bendable region; the first conductive pattern layer is on a side of the first passivation layer distal to the flexible substrate base; and the at least one inorganic insulating layer further includes the first passivation layer.

In some embodiments, the flexible substrate base further includes an expanding region on a side of the bonding region distal to the display region; the bendable region, the bonding region and the expanding region are sequentially arranged in a preset direction; the bendable region has a width in a range from 15 mm to 25 mm in the preset direction; the bonding region has a width in a range from 3.5 mm to 4.5 mm in the preset direction; and the expanding region has a width in a range from 4.5 mm to 5.5 mm in the preset direction.

According to one aspect of the present disclosure, a display device is provided. The display device includes: a plurality of light emitting elements and the driving substrate of claim 1, wherein the plurality of light emitting elements are on a side of the first conductive pattern layer distal to the flexible substrate base; each of the plurality of light emitting elements includes a first pin and a second pin which are electrically coupled to corresponding first connection terminals of the plurality of first connection terminals, respectively.

In some embodiments, the display device further includes a glass substrate base and a splicing enclosure, wherein the glass substrate base is on a side of the flexible substrate base distal to the plurality of thin film transistors, and the splicing enclosure is on a side of the glass substrate base distal to the flexible substrate base.

In some embodiments, a portion of the driving substrate at the bendable region extends along a side surface of the glass substrate base such that at least a sub-portion of the portion of the driving substrate in the bendable region is between the glass substrate base and the splicing enclosure, and the splicing enclosure is adhered to the driving substrate by an adhesive in a partial portion of the at least a sub-portion of the portion of the driving substrate in the bendable region.

According to one aspect of the present disclosure, a method of manufacturing the driving substrate is provided. The method includes: providing a flexible substrate base, wherein the flexible substrate base includes: a display region, a bendable region and a bonding region, and the bendable region is between the display region and the bonding region; forming a plurality of thin film transistors on the flexible substrate base, wherein the plurality of thin film transistors are in the display region; and forming a first conductive pattern layer on a side of the thin film transistors distal to the flexible substrate base, wherein the first conductive pattern layer includes: a plurality of first connection terminals and a plurality of signal supply lines, the plurality of first connection terminals are in the display region, a first number of first connection terminals of the plurality of first connection terminals are electrically coupled to first electrodes of the plurality of thin film transistors respectively, the plurality of signal supply lines are in the bendable region, two ends of each of the plurality of signal supply lines extend into the display region and the bonding region respectively, and the plurality of signal supply lines are coupled to a second number of first connection terminals other than the first number of first connection terminals of the plurality of first connection terminals; the method further includes forming at least one inorganic insulating layer between the first conductive pattern layer and the flexible substrate base such that the at least one inorganic insulating layer includes a hollowed-out pattern in the bendable region.

In some embodiments, the method further includes forming a first planarization layer on a side of the first conductive pattern layer distal to the flexible substrate base, wherein the forming the first planarization layer includes: coating a planarization material on a side of the first conductive pattern layer distal to the flexible substrate base to form a first planarization material film, wherein the plurality of signal supply lines have a thickness of H1 in a direction perpendicular to the flexible substrate base, and the first planarization material film has a maximum thickness of H2, H2 is approximately equal to H1; performing an etching process on the first planarization material film to expose the plurality of signal supply lines; coating a planarization material on a side of the first planarization material film and the exposed plurality of signal supply lines distal to the flexible substrate base to form a second planarization material film; and forming a first number of first vias extending to the first number of first connecting terminals of the plurality of first connecting terminals in the second planarization material film by a patterning process.

In some embodiments, the forming a plurality of thin film transistors and the forming at least one inorganic insulating layer includes: sequentially forming a first gate, a gate insulating layer, an active layer and an interlayer dielectric layer on the flexible substrate base; forming a first electrode, a second electrode and a second conductive pattern layer on a side of the interlayer dielectric layer distal to the flexible substrate base, wherein the second conductive pattern layer includes: a plurality of signal transmission lines; forming a second planarization layer on a side of the first electrode, the second electrode and the second conductive pattern layer distal to the flexible substrate base, such that a first number of third vias and a second number of fourth vias are formed in the second planarization layer, wherein the first number of third vias respectively extend to the first number of first connection terminals of the plurality of first connecting terminals electrically coupled to the first electrodes of the plurality of thin film transistors respectively, the second number of fourth vias respectively extend to the plurality of signal transmission lines, and the second planarization layer includes a hollowed-out pattern in the bendable region; forming a first passivation layer on the second planarization layer; removing portions of the first passivation layer, the interlayer dielectric layer and the gate insulating layer in the bendable region by an etching process; and removing portions of the first passivation layer at bottoms of the first number of third vias and the second number of fourth vias by an etching process.

DETAILED DESCRIPTION

In order to make those skilled in the art better understand the technical solution of the present disclosure, a driving substrate and a manufacturing method thereof, and a display device in the present disclosure are described in detail below with reference to the accompanying drawings.

Regarding a uIC direct driving mode and a TFT driving mode, since the uIC direct driving mode is difficult to be applied to actual products due to high cost and low yield, the TFT driving mode is mainly studied by various manufacturers. However, in practical applications, TFT manufacturing process inevitably results in many inorganic layers having a large Young's modulus, which is not favorable for bending the LED display substrate. That is, the TFT manufacturing process and the substrate bending requirement cannot coexist.

Figure 1:
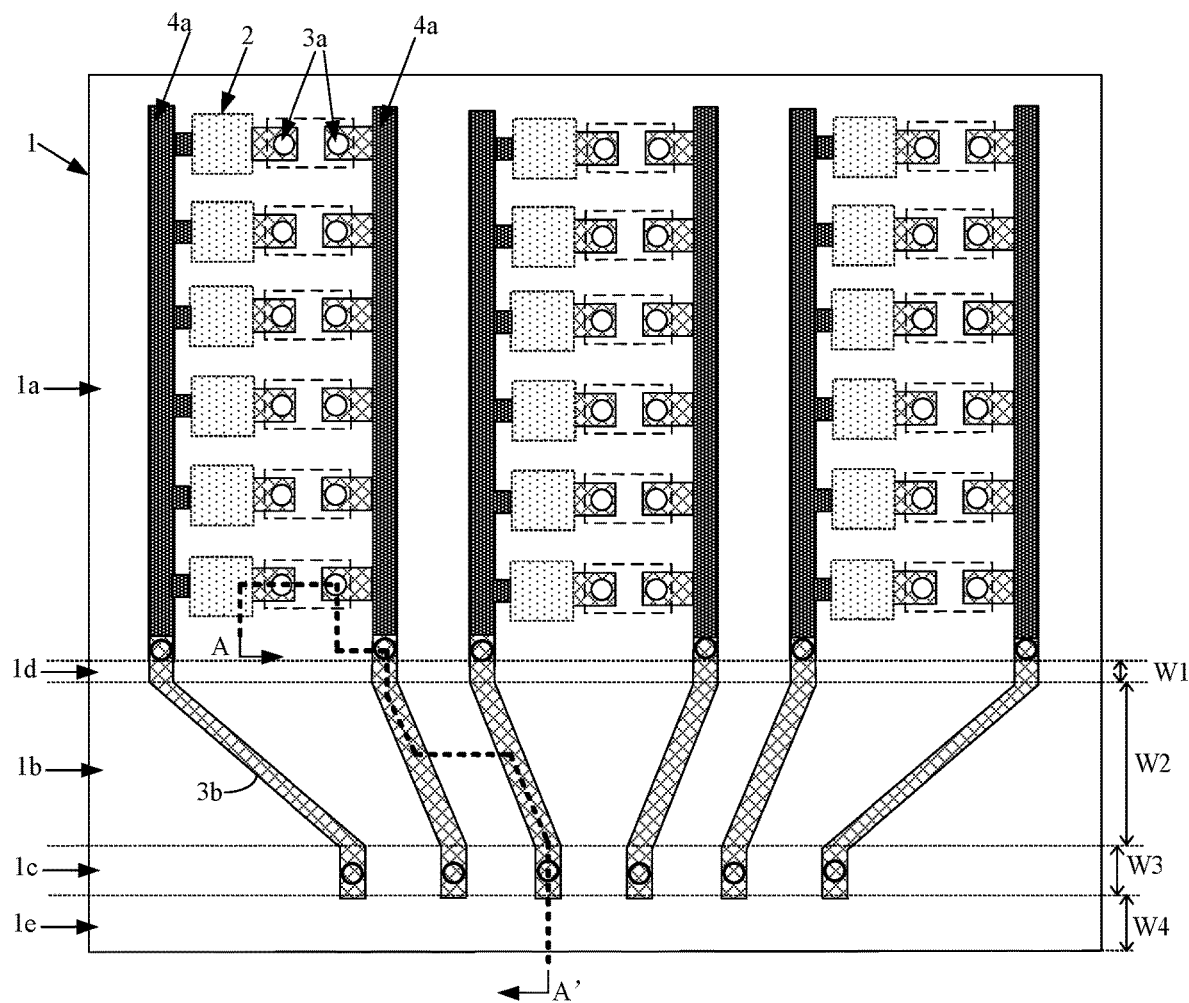
FIG. 1 is a top view of a driving substrate according to an embodiment of the present disclosure.
Figure 2:
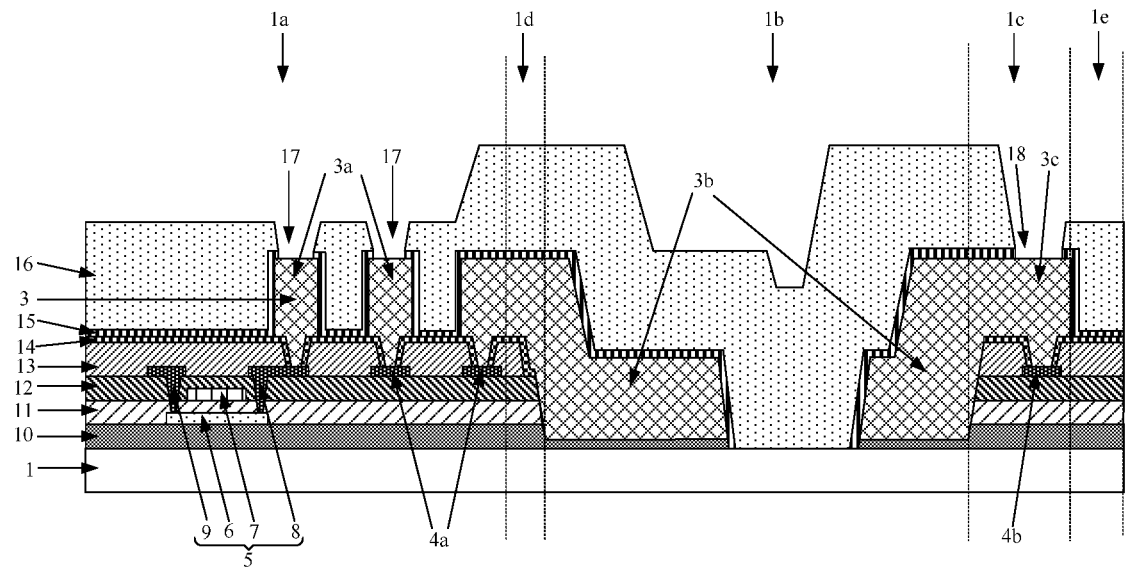
FIG. 2 is a schematic cross-sectional view of the driving substrate taken along line A-A' in FIG. 1.

FIG. 1 is a top view of a driving substrate according to an embodiment of the present disclosure, and FIG. 2 is a schematic cross-sectional view taken along a line A-A' in FIG. 1. As shown in FIGS. 1 and 2, the driving substrate includes: a flexible substrate base 1, a plurality of thin film transistors 5, and a first conductive pattern layer 3.

The flexible substrate base 1 includes: a display region 1a, a bendable region 1b, and a bonding region 1c. The display region 1a is used for display. The bendable region 1b is used for being bent during splicing driving substrates, so that the bonding region 1c may be on a back side of the flexible substrate base 1, thereby greatly reducing the distance between the display regions 1a and gaps of adjacent small-size LED display substrates when splicing small-size LED display substrates. The bonding region 1c is used for bonding with a flexible printed circuit (FPC), so that an external signal may be written into the driving substrate through the flexible printed circuit.

In some embodiments, a material of the flexible substrate base 1 includes polyimide. In some embodiments, the flexible substrate base 1 has a thickness in a range from 3 um to 10 um, for example, 4 um, 5 um, 6 um, 7 um, 8 um, or 9 um.

The plurality of thin film transistors 5 are on the flexible substrate base 1, and may be manufactured by related thin film transistor manufacturing processes, which will be described in detail later with reference to specific examples. In the process of manufacturing the plurality of thin film transistors 5 by the thin film transistor manufacturing process, at least one inorganic insulating layer is inevitably formed, and the at least one inorganic insulating layer includes a hollowed-out pattern (or is of a hollowed-out structure) in the bendable region 1b. That is, at least a portion or all of the at least one inorganic insulating layer in the bendable region 1b is removed (in other words, there are openings to pass through the at least one inorganic insulating layer in the bendable region 1b), or the thickness of the at least one inorganic insulating layer in the bendable region 1b is reduced relative to that in the display region. Optionally, the portion of the at least one inorganic insulating layer in the bendable region has a thickness in a range from 0 Å to 2000 Å.

It should be noted that, in the process of manufacturing the plurality of thin film transistors 5 by the thin film manufacturing transistor process, a gate insulating layer 11 is necessarily formed between a gate and an active layer of the thin film transistor. A material of the gate insulating layer 11 includes an inorganic insulating material (typically silicon oxide and/or silicon nitride). Therefore, in the embodiment of the present disclosure, at least the gate insulating layer 11 between the first conductive pattern layer and the flexible substrate base 1 may be used as the inorganic insulating layer.

In the embodiment of the present disclosure, each of LED chips is configured with a corresponding pixel driving circuit 2 for providing a driving current to a corresponding LED chip to drive the corresponding LED chip to emit light. Each of pixel driving circuits 2 includes a number of thin film transistors 5. It should be noted that the specific circuit structure of the pixel driving circuit 2 is not limited in the technical solution of the present disclosure, and FIG. 2 merely illustrates one thin film transistor coupled to the LED chip in the pixel driving circuit.

The first conductive pattern layer 3 is on a side of the plurality of thin film transistors 5 distal to the flexible substrate base 1, and includes a plurality of first connection terminals 3a (also referred to as pads) and a plurality of signal supply lines 3b. The plurality of first connection terminals 3a are in the display region 1a, and some of the first connection terminals 3a (a first number of first connection terminals of the plurality of first connection terminals 3a) are electrically coupled to first electrodes 8 of the plurality of thin film transistors 5. The signal supply lines 3b are in the bendable region 1b, and two ends of the signal supply lines 3b extend into the display region 1a and the bonding region 1c, respectively. The signal supply lines 3b are coupled to a second number of first connection terminals 3a other than the first number of first connection terminals 3a of the plurality of first connection terminals 3a in the display region 1a coupled to the first electrodes 8 of the plurality of thin film transistors 5, so that external signals from the FPC may reach the display region 1a through the signal supply lines 3b.

In the embodiment of the present disclosure, at least a portion of the inorganic insulating layer in the bendable region 1b is of a hollowed-out structure, so that the Young's modulus of the driving substrate at the bendable region 1b is not increased due to the inorganic insulating layer, and the driving substrate at the bendable region 1b may be normally bent, thereby achieving the coexistence of the thin film transistor manufacturing process and the substrate bending requirement.

Referring to FIG. 2, in some embodiments, the thin film transistor 5 is a top gate thin film transistor, i.e., a gate 7 is on a side of an active layer 6 distal to the flexible substrate base 1. A first electrode 8 and a second electrode 9 are on a side of the gate 7 distal to the flexible substrate base 1. A gate insulating layer 11 is between the active layer 6 and the gate 7. An interlayer dielectric layer 12 (typically made of a material including silicon oxide and/or silicon nitride) is between the first and second electrodes 8 and 9 and the active layer 6. The first electrode 8 and the second electrode 9 are coupled to the active layer 6 through vias in the interlayer dielectric layer 12. In this case, the inorganic insulating layer may include the interlayer dielectric layer 12 and the gate insulating layer 11.

In the embodiment of the present disclosure, one of the first electrode 8 and the second electrode 9 of the thin film transistor 5 is a source, and the other is a drain. In some cases, the source and the drain may be interchanged.

It should be noted that the case where the thin film transistor shown in FIG. 2 is a top gate thin film transistor is only used for exemplary purposes, and does not limit the technical solution of the present disclosure. In the embodiment of the present disclosure, the thin film transistor 5 may also be of other structure, such as a bottom gate thin film transistor, a double-gate thin film transistor, and the like.

When the thin film transistor 5 is a bottom gate thin film transistor, a gate 7 is on a side of an active layer 6 proximal to the flexible substrate base 1, a first electrode 8 and a second electrode 9 are on a side of the active layer 6 distal to the flexible substrate base 1, a gate insulating layer 11 is between the active layer 6 and the gate, and an interlayer dielectric layer 12 is between the first and second electrodes 8 and Sand the active layer 6. In this case, the inorganic insulating layer may include the interlayer dielectric layer 12 and the gate insulating layer 11.

Figure 3:
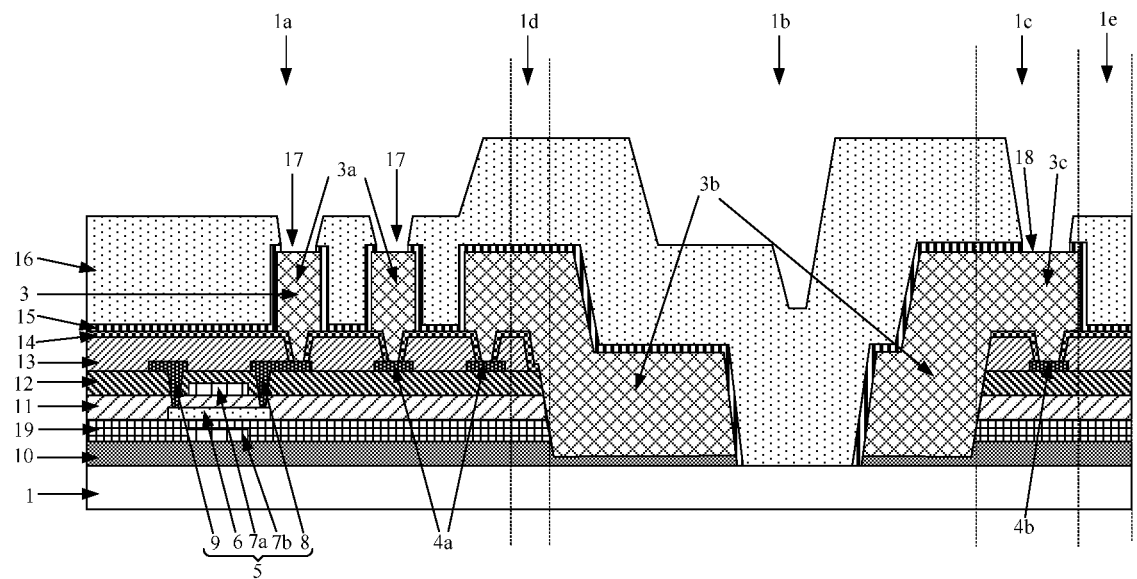
FIG. 3 is a schematic cross-sectional view of the driving substrate taken along line A-A' in FIG. 1.

FIG. 3 is a schematic cross-sectional view taken along line A-A' in FIG. 1. As shown in FIG. 3, the thin film transistor 5 is a double-gate thin film transistor. Specifically, the thin film transistor 5 includes a first gate 7a, a second gate 7b, a first electrode 8, and a second electrode 9 (not shown in FIG. 3). The second gate 7b is on a side of the active layer 6 proximal to the flexible substrate base 1, and the first gate 7a is on a side of the active layer 6 distal to the flexible substrate base 1. The first electrode 8 and the second electrode 9 are on a side of the first gate 7a distal to the flexible substrate base 1. A buffer layer 19 is between the second gate 7b and the active layer 6. A gate insulating layer 11 is between the first gate 7a and the active layer 6. An interlayer dielectric layer 12 is between the first and second electrodes 8 and 9 and the first gate 7a. The first gate 7a and the second gate 7b are electrically coupled by a connection line (not shown, in a same layer as the first electrode 8 and the second electrode 9, and having two ends coupled to vias extending to the first gate 7a and the second gate 7b, respectively). In this case, the inorganic insulating layer may include the buffer layer 19, the gate insulating layer 11, and the interlayer dielectric layer 12.

Continuing to refer to FIGS. 2 and 3, in some embodiments, the driving substrate further includes an isolation barrier layer 10 between the flexible substrate base 1 and the plurality of thin film transistors 5 for preventing impurities such as particles, moisture, oxygen in the flexible substrate base 1 from diffusing into the above functional film layers, in order to avoid abnormity of the functional film layers on the flexible substrate base 1.

In some embodiments, a portion of the isolation barrier layer 10 in the display region 1a has a thickness greater than that in the bendable region 1b. Since the electrical characteristics of the thin film transistor 5 in the display region 1a are relatively sensitive, if impurities such as particles, moisture, and oxygen diffuse into the active layer 6 of the thin film transistor 5, the electrical characteristics of the thin film transistor 5 may be changed greatly, and thus, high isolation barrier requirement for the isolation barrier layer 10 in the display region 1a is required. Since only the signal supply lines 3b exist in the bendable region 1b, the electrical characteristics of the signal supply lines 3b are relatively slightly affected by impurities such as particles, moisture, and oxygen (the signal supply lines 3b are generally made of a metal material, and when oxidizing particles diffuse into the signal supply lines 3b, the surface of the metal material is easily oxidized, so that the resistance of the signal supply lines 3b are slightly increased), and therefore, relatively low isolation barrier requirement for the isolation barrier layer 10 in the bendable region 1b is required.

The thickness of the isolation barrier layer 10 directly determines the isolation barrier performance. In general, the greater the thickness of the isolation barrier layer 10 is, the better the isolation barrier performance is. Therefore, in the present disclosure, the thickness of the portion of the isolation barrier layer 10 in the display region 1a is greater than the thickness of the portion of the isolation barrier layer 10 in bendable region 1b. Since the portion of the isolation barrier layer 10 in the bendable region 1b has a relatively small thickness, the Young's modulus of the driving substrate in the overall bendable region may be effectively reduced, which is beneficial for the bending of the driving substrate.

In some embodiments, the thickness of the portion of the isolation barrier layer 10 in the display region 1a is in a range from 6500 Å to 9500 Å. The thickness of the isolation barrier layer 10 at the bendable region 1b and overlapping with the plurality of signal supply lines in a direction perpendicular to the flexible substrate base is in a range from 1000 Å to 2000 Å. The isolation barrier layer 10 with a greater thickness in the display region may effectively prevent impurities such as particles, moisture, oxygen and the like in the flexible substrate base 1 from diffusing to the thin film transistor 5. The isolation barrier layer 10 with a smaller thickness at the bendable region 1b may effectively reduce the overall Young's modulus of the driving substrate at the bendable region while maintaining isolation barrier performance, which is beneficial to the bending of the driving substrate. Optionally, a portion of the isolation barrier layer in the bendable region and not overlapping with the plurality of signal supply lines in the direction perpendicular to the flexible substrate base has a thickness of zero, that is, the isolation barrier layer is absent.

In some embodiments, the portion of the isolation barrier layer 10 in the display region 1a includes silicon oxide SiO (having a thickness of about 500 Å), silicon nitride SiN (having a thickness of about 1000 Å), and silicon oxide SiO (having a thickness in a range from 5000 Å to 8000 Å) sequentially arranged along a direction away from the flexible substrate base 1. The portion of the isolation barrier layer 10 in the bendable region 1b includes SiO (having a thickness of about 500 Å) and SiN (having a thickness in a range from about 500 Å to 1000 Å) sequentially disposed along the direction away from the flexible substrate base 1. In some embodiments, SiO (having a thickness of about 500 Å) is further provided on a side of the SiN distal to the flexible substrate base 1.

With continued reference to FIGS. 2 and 3, in some embodiments, the first conductive pattern layer 3 further includes a plurality of second connection terminals 3c in the bonding region 1c electrically coupled to the plurality of signal supply lines 3b, respectively.

In some embodiments, a first planarization layer 16a is on a side of the first conductive pattern layer 3 distal to the flexible substrate base 1. The first planarization layer 16 is provided with first vias 17 therein extending to the first connection terminals 3a in regions corresponding to where the first connection terminals 3a are located along the direction perpendicular to the flexible substrate base 1. The first planarization layer 16 is provided with second vias 18 therein extending to the second connection terminal 3c at regions corresponding to where the second connection terminals 3c are located along the direction perpendicular to the flexible substrate base 1.

In practice, pins of the LED chip may be electrically coupled to the first connection terminals 3a through the first vias 17 in the first planarization layer 16 by a die bonding process, and connection pins on the FPC may be bonded to the second connection terminals 3c through the second vias 18 in the first planarization layer 16 by the bonding process. The die bonding process of the LED chip and the FPC bonding process may be performed in any conventional manner in the related art, which are not described in detail herein.

In some embodiments, a second passivation layer 15 is between the first planarization layer 16 and the first conductive pattern layer 3. The second passivation layer 15 is provided with connection holes therein in regions along the direction perpendicular to the flexible substrate base 1 corresponding to where the first and second vias 17 and 18 are located, to expose the first and second connection terminals 3a and 3c. The second passivation layer 15 can effectively prevent impurities such as particles, moisture, oxygen, etc., in the first planarization layer 16 from diffusing into the first conductive pattern layer 3, thereby prolonging the service life of the driving substrate.

In some embodiments, the portions of the second passivation layer 15 and the isolation barrier layer 10 in the bendable region 1b and not covering a second conductive pattern layer 4 is of a hollowed-out structure (i.e., partially or completely being hollowed out). The inorganic material in the bendable region 1b is further reduced, and the overall Young's modulus of the driving substrate in the bendable region can be further reduced.

In some embodiments, the driving substrate further includes: a second conductive pattern layer 4 between the first conductive pattern layer 3 and the flexible substrate base 1. The second conductive pattern layer 4 includes a plurality of signal transmission lines 4a. The second number of first connection terminals 3a not electrically coupled to the first electrodes 8 of the thin film transistors 5 are electrically coupled to corresponding signal supply lines 3b through the corresponding signal transmission lines 4a respectively. The plurality of first connection terminals 3a may further include first connection terminals in addition to the first and second number of first connection terminals, so as to be coupled to other structures of the driving substrate, which will not be repeated herein.

In the embodiment of the present disclosure, the signal transmission lines 4a in the second conductive pattern layer 4 is used for electrical connection between the conductive structures in the display region 1a, so as to implement transmission of signals in the display region 1a. Exemplary, the signal transmission lines 4a may include data lines, wires connecting different thin film transistors 5 in the pixel driving circuit 2, connection lines connecting the first gate 7a and the second gate 7b in FIG. 3, and the like. The types and number of the signal transmission lines 4a in the second conductive pattern layer 4 are not limited in the technical solution of the present disclosure.

In some embodiments, the second conductive pattern layer 4 further includes a plurality of conductive electrodes 4b in the bonding region 1c and coupled in parallel to the second connection terminals 3c, so that the equivalent resistance of the second connection terminals 3c can be effectively reduced.

In some embodiments, the second conductive pattern layer 4 is in a same layer as the first electrode 8 and the second electrode 9. In this case, the first electrode 8, the second electrode 9, and the second conductive pattern layer 4 may be simultaneously manufactured by a single source-drain manufacturing process.

In some embodiments, a second planarization layer 13 is on a side of the first and second electrodes 8 and 9 distal to the flexible substrate base 1. A first passivation layer 14 is on a side of the second planarization layer 13 distal to the flexible substrate base 1. The second planarization layer 13 is of a hollowed-out structure (i.e., partially or completely being hollowed out) in the bendable region 1b. The first conductive pattern layer 3 is on a side of the first passivation layer 14 distal to the flexible substrate base 1. In this case, the inorganic insulating layer further includes the first passivation layer 14.

Figure 4:
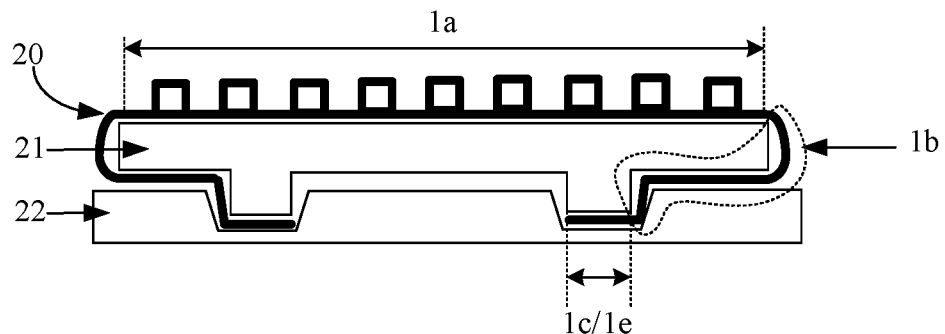
FIG. 4 is a schematic view illustrating assembly of a driving substrate after being bent and a splicing enclosure according to an embodiment of the present disclosure.

FIG. 4 is a schematic view illustrating assembly of a driving substrate after being bent and a splicing enclosure according to an embodiment of the present disclosure. As shown in FIGS. 1 to 4, an expansion region 1e is on a side of the bonding region 1c distal to the display region 1a, and the bendable region 1b, the bonding region 1c, and the expansion region 1e are sequentially arranged along a preset direction.

In some embodiments, the bendable region 1b has a width W2 in a range from 15 mm to 25 mm, for example in the preset direction, 20 mm. The bonding region 1c has a width W3 in a range from 3.5 mm to 4.5 mm in the preset direction, for example, 4 mm. The expansion region 1e has a width W4 in a range from 4.5 mm to 5.5 mm in the preset direction, for example, 5 mm.

In some embodiments, a reserved bending region 1d is between the display region 1a and the bendable region 1b to prevent the portion of the driving substrate in the display region 1a proximal to to the bendable region 1b from being bent when the driving substrate at the bendable region 1b is bent. The reserved bending region has a width in a range from 0.8 mm to 1.2 mm in the preset direction, for example, 1 mm.

Referring to FIG. 4, in some embodiments, the bendable region 1b, the bonding region 1c, and the expansion region 1e are disposed on both left and right sides of the driving substrate 20, i.e., portions of the driving substrate 20 at both left and right sides may be bent.

In the process of splicing the driving substrate 20, the driving substrate 20 needs to be bent at the bendable region 1b, then the driving substrate 20 is assembled and fixed with a glass substrate base 21, and finally the glass substrate base 21 carrying the driving substrate 20 is assembled and fixed with a splicing enclosure 22. The portions of the driving substrate 20 in the bendable region 1b, the bonding region 1c and the expanding region 1e are finally bent into a structure of a step, and the driving substrate at the bonding region 1c and the expanding region 1e are sandwiched between the back side of the glass substrate base 21 and the splicing enclosure 22.

A method for manufacturing a driving substrate in the foregoing embodiments is provided, and will now be described in detail below with reference to the accompanying drawings.

Figure 5:
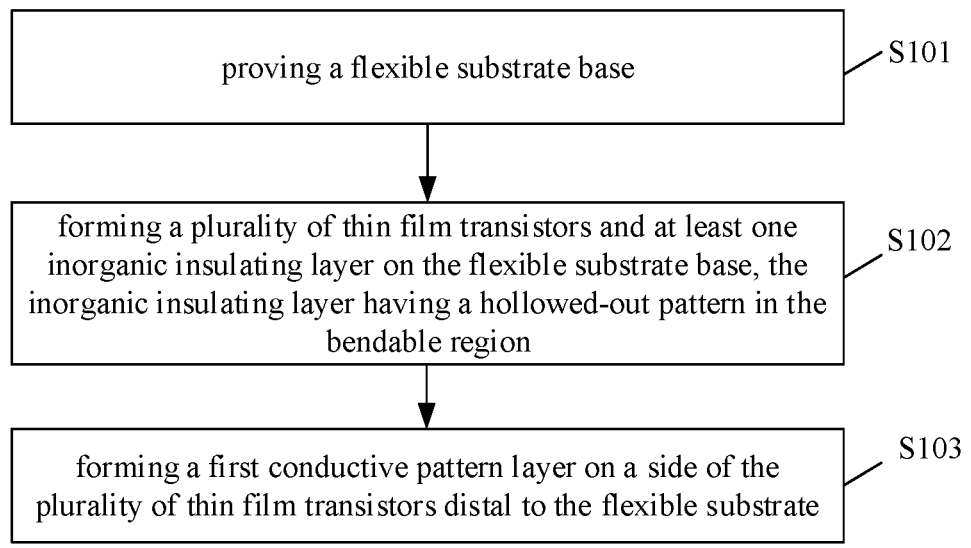
FIG. 5 is a flowchart illustrating a method for manufacturing a driving substrate according to an embodiment of the present disclosure.

FIG. 5 is a flowchart illustrating a method for manufacturing a driving substrate according to an embodiment of the present disclosure. As shown in FIG. 5, the method includes the following steps.

In step S101, a flexible substrate base is provided. The flexible substrate base may include a display region, a bendable region and a bonding region, and the bendable region is between the display region and the bonding region.

In step S102, a plurality of thin film transistors and at least one inorganic insulating layer are formed on the flexible substrate base. The inorganic insulating layer includes a hollowed-out pattern in the bendable region. The plurality of thin film transistors are in the display region.

In step S103, a first conductive pattern layer is formed on a side of the plurality of thin film transistors distal to the flexible substrate.

The first conductive pattern layer includes a plurality of first connection terminals and a plurality of signal supply lines. The plurality of first connection terminals are in the display region. A first number of first connection terminals of the plurality of first connection terminals are electrically coupled to first electrodes of the plurality of thin film transistors respectively. The plurality of signal supply lines are in the bendable region, and two ends of the plurality of signal supply lines extend into the display region and the bonding region respectively. At least one inorganic insulating layer is between the first conductive pattern layer and the flexible substrate base, to make at least a portion of the at least one inorganic insulating layer to be hollowed out in the bendable region.

Figure 6:
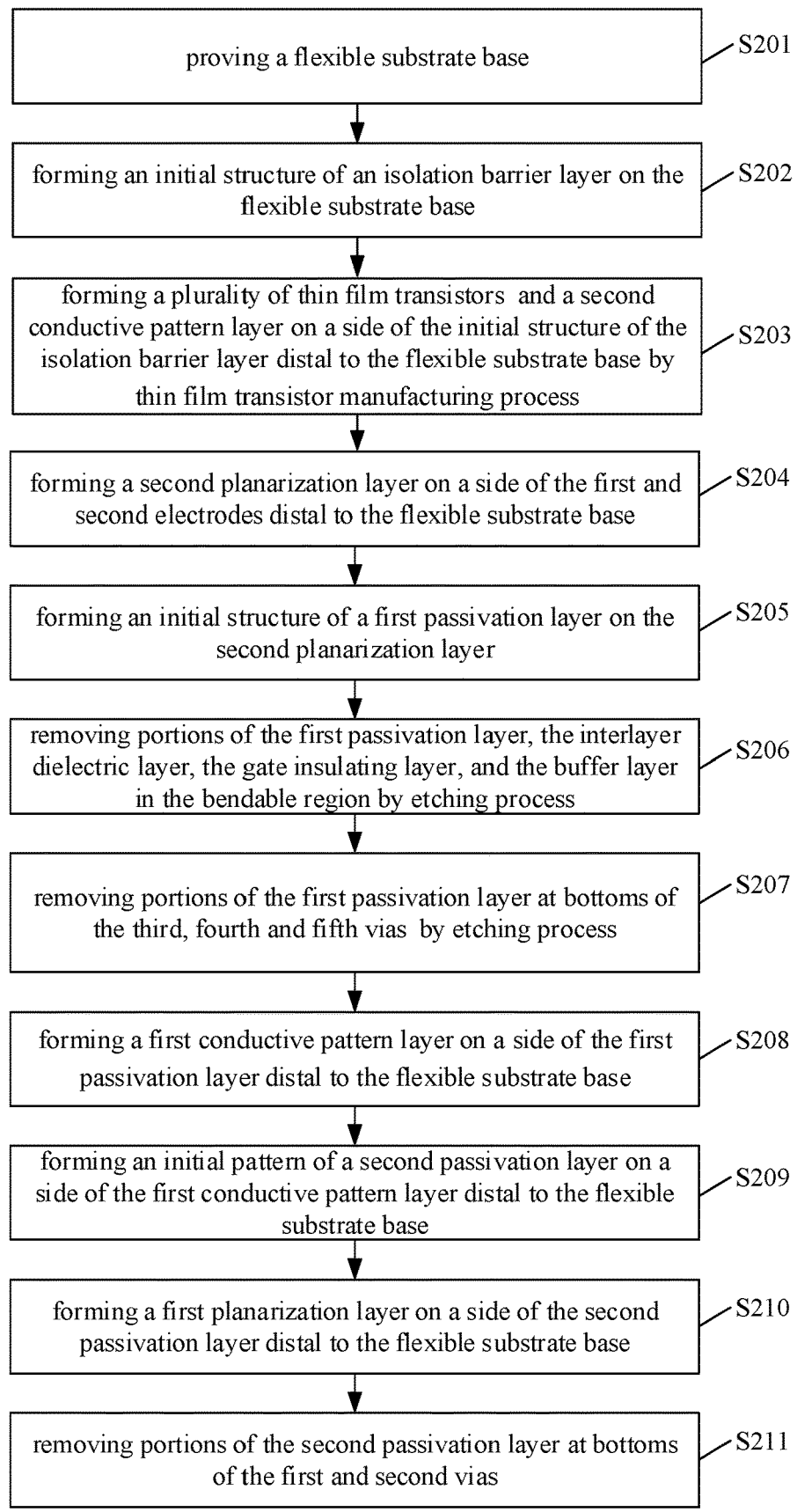
FIG. 6 is a flowchart illustrating a method for manufacturing a driving substrate according to an embodiment of the present disclosure.
Figure 7A:
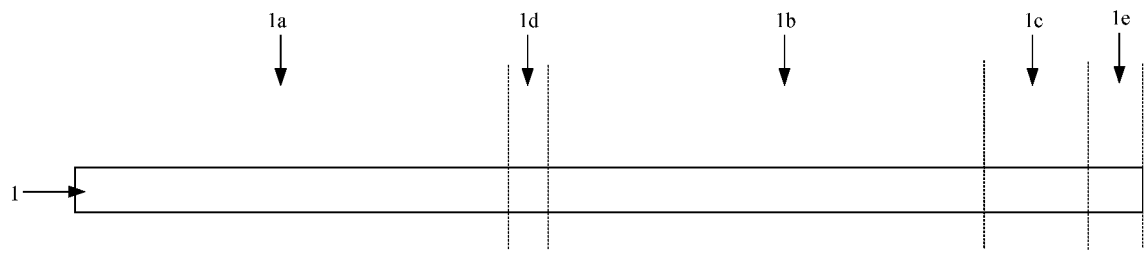
FIGS. 7a to 7j are schematic views illustrating intermediate structures of a driving substrate corresponding to steps of the method in FIG. 6.
Figure 7B:
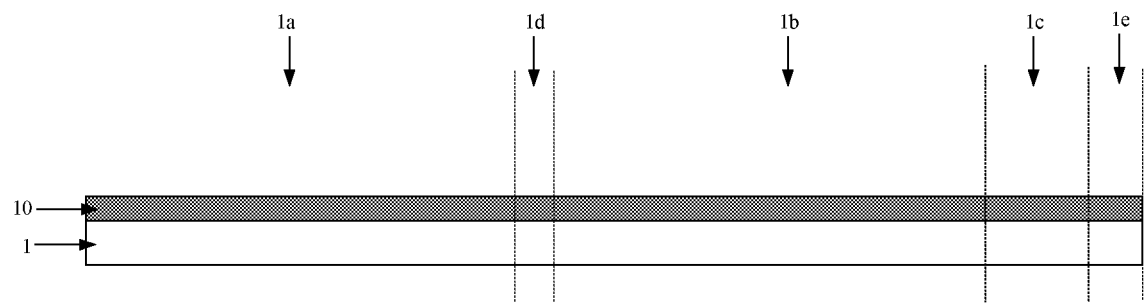
Figure 7C:
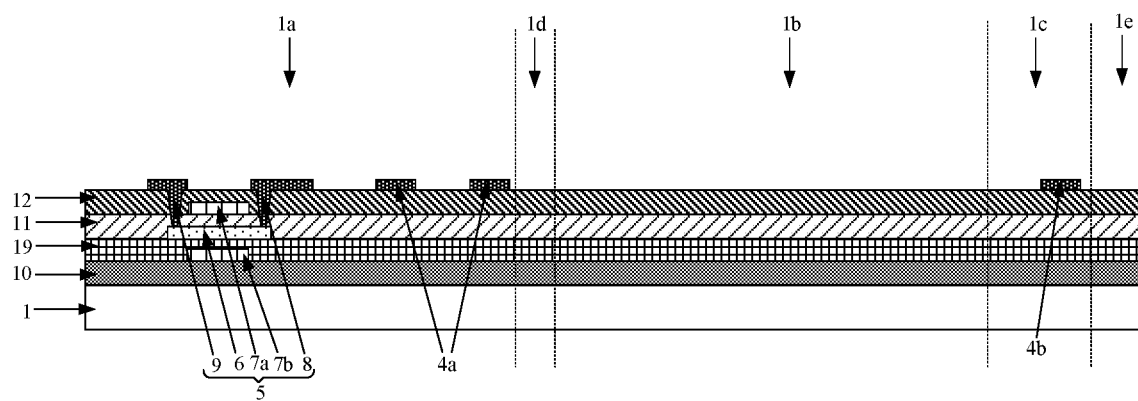
Figure 7D:
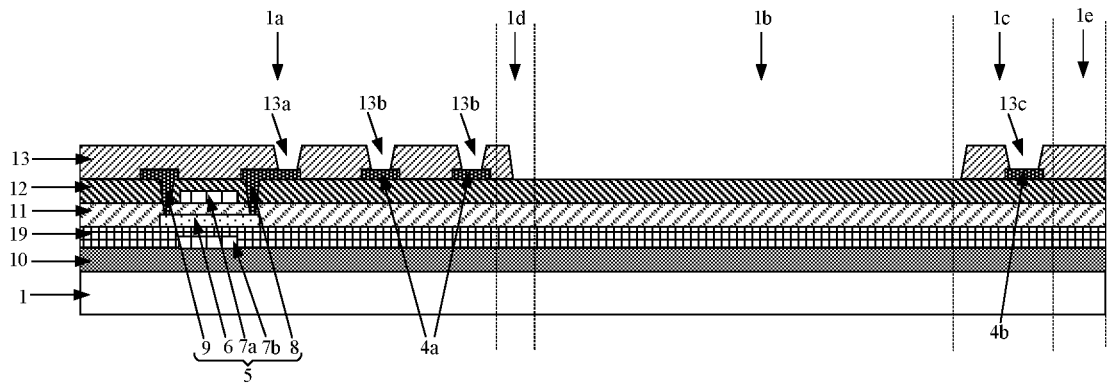
Figure 7E:
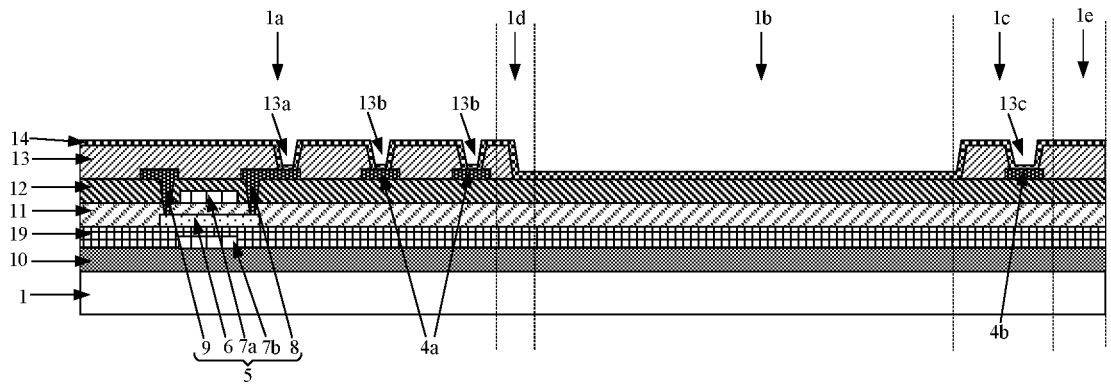
Figure 7F:
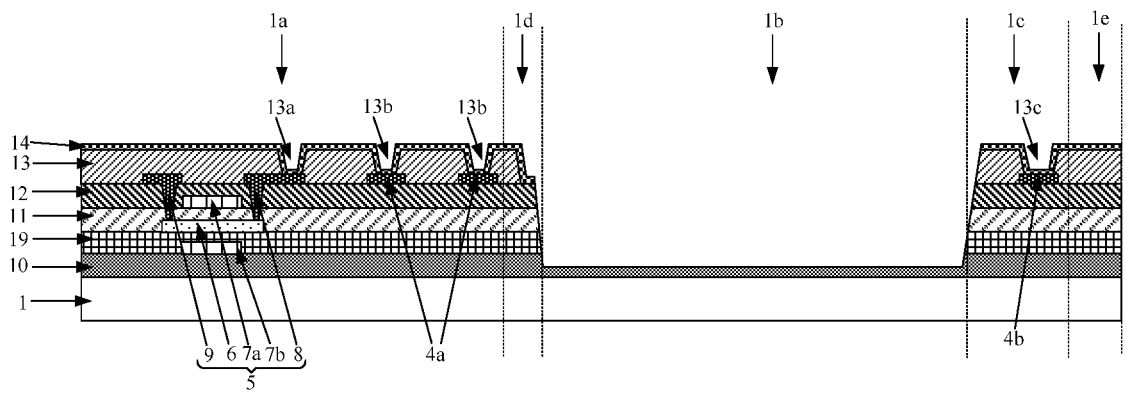
Figure 7G:
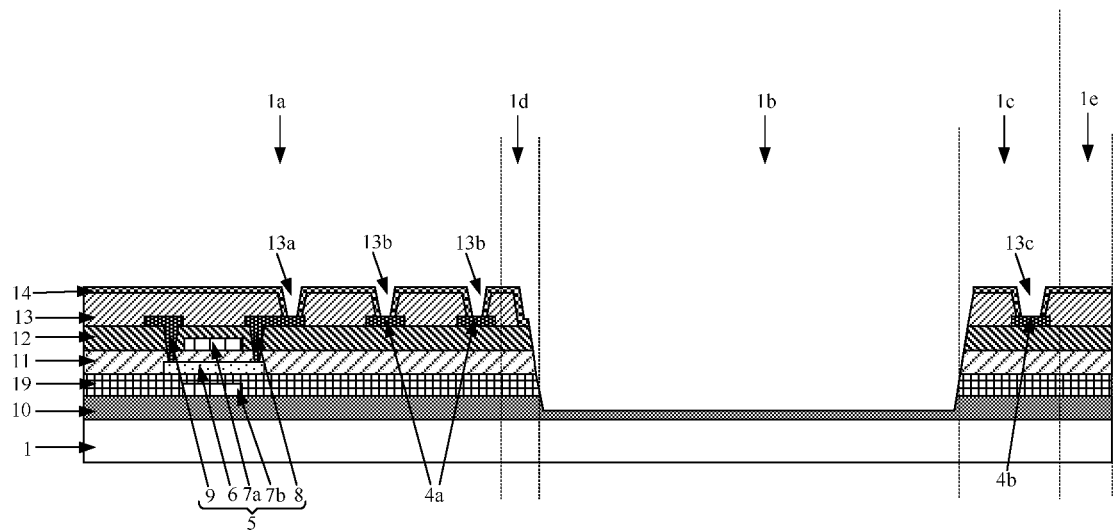
Figure 7H:
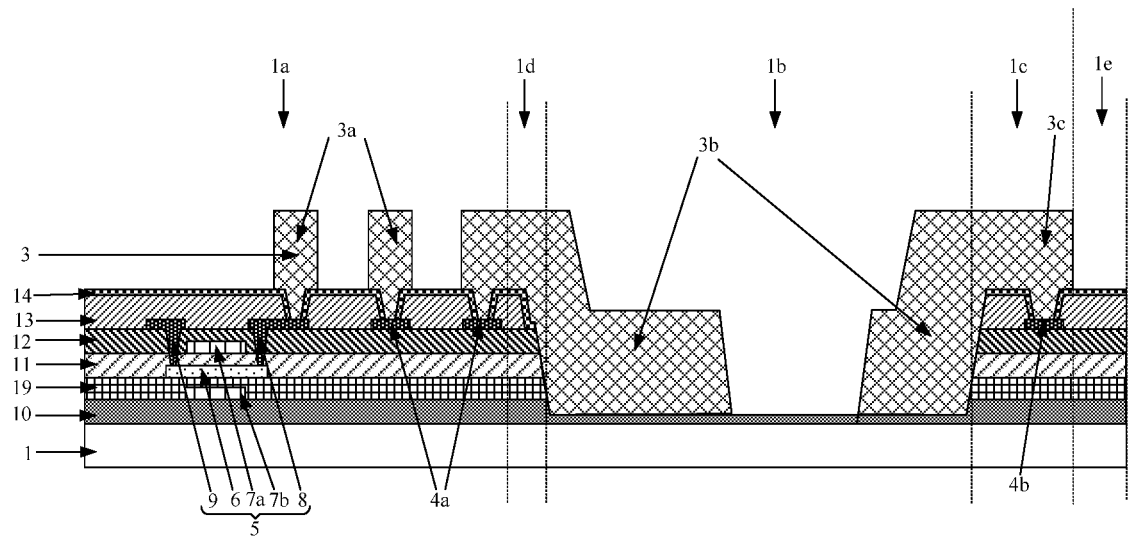
Figure 7I:
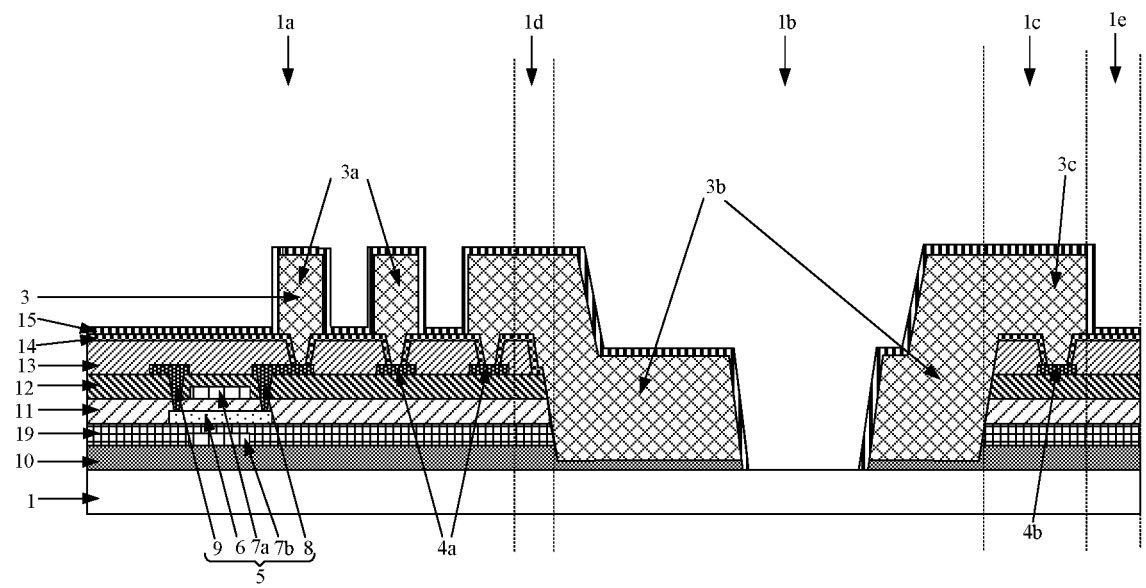
Figure 7J:
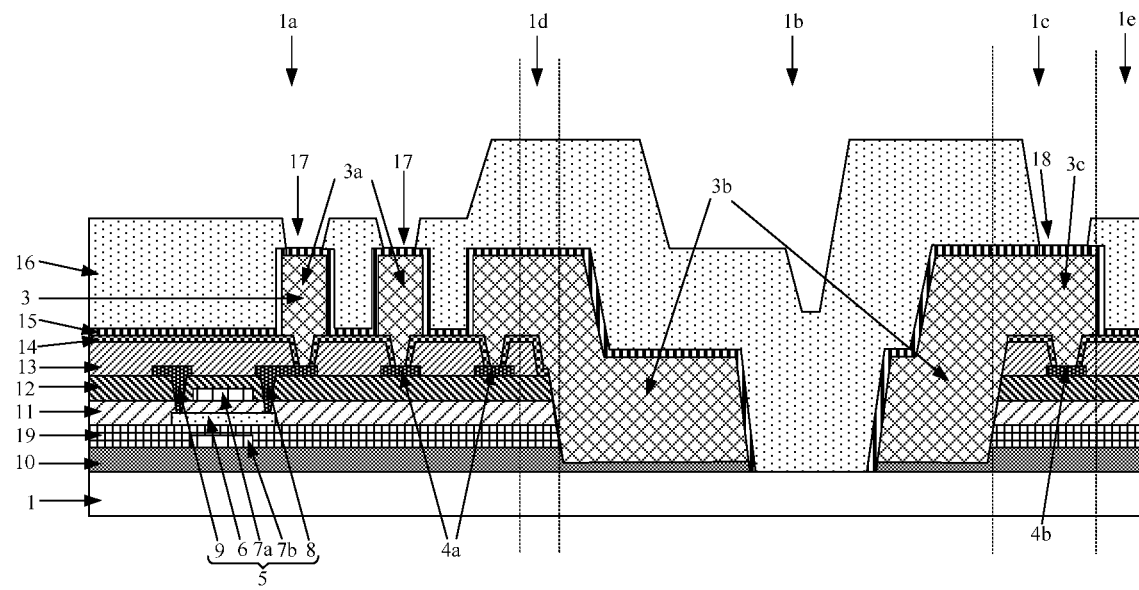

FIG. 6 is a flowchart illustrating a method for manufacturing a driving substrate according to an embodiment of the present disclosure, and FIGS. 7a to 7j are schematic views illustrating intermediate structures of a driving substrate corresponding to steps of the method in FIG. 6. As shown in FIGS. 6 to 7j, manufacturing the driving substrate shown in FIGS. 2 and 3 is taken as an example.

In step S201, a flexible substrate base is provided.

Referring to FIG. 7a, the flexible substrate base 1 includes a display region 1a, a bendable region 1b and a bonding region 1c. The bendable region 1b is between the display region 1a and the bonding region 1c. In some embodiments, a reserved bending region 1d is further between the display region 1a and the bendable region 1b, and an expansion region 1e is further on a side of the bonding region 1c distal to the display region 1a.

In step S202, an initial structure of an isolation barrier layer is formed on the flexible substrate base.

Referring to FIG. 7b, in some embodiments, the initial structure of the isolation barrier layer includes a SiO film (having a thickness of about 500 Å), a SiN film (having a thickness of about 1000 Å), and a SiO film (having a thickness in a range from 5000 Å to 8000 Å) sequentially arranged along a direction away from the flexible substrate base 1. The SiO film and the SiN film may be manufactured by a sputtering process. The three stacked films of SiO, SiN and SiO have a total thickness in a range from 6500 Å to 9500 Å.

In step S203, a plurality of thin film transistors 5 and a second conductive pattern layer 4 are formed on a side of the initial structure of the isolation barrier layer distal to the flexible substrate base 1 by a thin film transistor manufacturing process.

In a case where manufacturing the thin film transistors 5 shown in FIG. 2 is taken as an example, the step S203 specifically includes the following steps. Firstly, an active layer 6 is formed on a side of the initial structure of the isolation barrier layer distal to the flexible substrate base 1 by a patterning process. Then, a gate insulating layer 11 is formed on a side of the active layer 6 distal to the flexible substrate base 1 by a sputtering process. Next, a first gate 7a is formed on a side of the gate insulating layer 11 distal to the flexible substrate base 1 by a patterning process. Next, an interlayer dielectric layer 12 is formed on a side of the first gate 7a distal to the flexible substrate base 1 by a sputtering process. Finally, a first electrode 8, a second electrode 9 and conductive structures in the second conductive pattern layer 4 (e.g., signal transmission lines in the display region 1a, and conductive electrodes 4b in the bonding region 1c, which are not shown in the drawings) are formed on a side of the interlayer dielectric layer 12 distal to the flexible substrate base 1 by a patterning process.

In the embodiments of the present disclosure, the "patterning process" may also be referred to as a composition process, and refers to steps for forming a structure having a specific pattern, which may include a photolithography process including one or more steps of coating, exposing, developing, etching, and stripping of photoresist after a material film is formed. Of course, the "patterning process" may also include imprinting process, inkjet printing process, or other processes.

Referring to FIG. 7c, in a case where manufacturing the thin film transistor 5 shown in FIG. 3 is taken as an example, the step S203 specifically includes the following steps. Firstly, a second gate 7b is formed on a side of the initial structure of the isolation barrier layer distal to the flexible substrate base 1 by a patterning process. Then, a buffer layer 19 (made of a material including SiO and/or SiN) is formed on a side of the second gate 7b distal to the flexible substrate base 1 by a sputtering process. Then, an active layer 6 is formed on a side of the buffer layer 19 distal to the flexible substrate base 1 by a patterning process. Next, a gate insulating layer 11 is formed on a side of the active layer 6 distal to the flexible substrate base 1 by a sputtering process. Next, a first gate 7a is formed on a side of the gate insulating layer 11 distal to the flexible substrate base 1 by a patterning process. Next, an interlayer dielectric layer 12 is formed on a side of the first gate 7a distal to the flexible substrate base 1 by a sputtering process. Finally, a first electrode 8, a second electrode 9 and conductive structures in the second conductive pattern layer 4 (e.g., signal transmission lines in the display region 1a, and conductive electrodes 4b in the bonding region 1c) are formed on a side of the interlayer dielectric layer 12 distal to the flexible substrate base 1 by a patterning process.

In some embodiments, the first electrode 8, the second electrode 9, and the second conductive pattern layer 4 are made of metal materials.

In step S204, a second planarization layer is formed on a side of the first and second electrodes distal to the flexible substrate base.

Referring to FIG. 7d, a second planarization layer 13 is formed on a side of the first and second electrodes distal to the flexible substrate base. Third vias 13a extending to the first electrodes 8 of the thin film transistors 5, fourth vias 13b extending to the signal transmission lines 4a, and fifth vias 13c extending to the conductive electrodes 4b are formed in the second planarization layer 13. The second planarization layer 13 includes a hollow-out pattern in the bendable region 1b.

In step S205, an initial structure of a first passivation layer 14 is formed on the second planarization layer 13.

Referring to FIG. 7e, a passivation material film is formed by a sputtering process to form an initial structure of a first passivation layer 14.

In step S206, portions of the first passivation layer, the interlayer dielectric layer, the gate insulating layer, and the buffer layer in the bendable region are removed by an etching process.

As shown in FIG. 7f, the portions of the first passivation layer 14, the interlayer dielectric layer 12, and the gate insulating layer 11 in the bendable region 1b are completely removed by a dry etching process, and the portion of the initial structure of the isolation barrier layer in the bendable region 1b is thinned, so that the thickness of the portion of the final isolation barrier layer 10 in the bendable region 1b is in a range from 1000 Å to 2000 Å.

In step S207, portions of the first passivation layer at bottoms of the third, fourth and fifth vias are removed by an etching process.

Referring to FIG. 7g, the portions of the first passivation layer 14 at the bottoms of the third, fourth, and fifth vias 13a, 13b and via 13c are removed by a dry etching process, such that the conductive structures under the third, fourth, and fifth vias 13a, 13b and via 13c are exposed.

Since the second planarization layer 13 is made of an organic material which itself contains a certain amount of water and oxygen, gas in the organic material overflows from the second planarization layer 13 in a high temperature process. If the gas cannot be discharged in time, bulges may easily occur in the first passivation layer 14. For this reason, in the embodiment of the present disclosure, while the second etching of the first passivation layer 14 in S207, exhaust holes (not shown) are also formed in the first passivation layer 14 to form a final pattern of the first passivation layer 14.

In step S208, a first conductive pattern layer is formed on a side of the first passivation layer distal to the flexible substrate base.

Referring to FIG. 7h, the first conductive pattern layer 3 includes a plurality of first connecting terminals 3a, a plurality of second connecting terminals 3c and a plurality of signal supply lines 3b. The first connection terminals 3a are in the display region 1a, the second connection terminals 3c are in the bonding region 1c, a first number of first connection terminals of the plurality of first connection terminals 3a are electrically coupled to the first electrodes 8 of the thin film transistors 5. The plurality of signal supply lines 3b are in the bendable region 1b, and two ends of the signal supply lines 3b extend into the display region 1a and the bonding region 1c, respectively.

The first connection terminals 3a are coupled to corresponding first electrodes 8 and corresponding signal transmission lines 4a through the third vias 13a and the fourth vias 13b, respectively. One end of the signal supply line 3b extending to the display region 1a is coupled to corresponding signal transmission line 4a through a fourth via. The other end of the signal supply line 3b extending to the bonding region 1c is coupled to the second connection terminal 3c. The second connection terminal 3c is coupled to the conductive electrode 4b through the fifth via 13c.

In some embodiments, the first conductive pattern layer 3 is made of copper.

In order to minimize the voltage drop of the conductive structures in the first conductive pattern layer 3 due to their own resistance, the conductive structures in the first conductive pattern layer 3 generally have a greater thickness. If the first conductive pattern layer 3 is made of copper, the conductive structures made of copper generally have a thickness greater than 2 um.

In step S209, an initial pattern of a second passivation layer is formed on a side of the first conductive pattern layer distal to the flexible substrate base.

Referring to FIG. 7i, firstly, a passivation material film is formed by a sputtering process, and then exhaust holes extending to the exhaust holes in the first passivation layer 14 is formed in the passivation material film through a patterning process, and portions of the passivation material film and the isolation barrier layer 10 in the bendable region 1b and not covering the second conductive pattern layer 4 are removed to form an initial pattern of the second passivation layer 15 and a final pattern of the isolation barrier layer 10.

In step S210, a first planarization layer 16 is formed on a side of the second passivation layer 15 distal to the flexible substrate base 1.

Referring to FIG. 7j, first vias 17 extending to the first connection terminals 3a are formed in the first planarization layer 16 at regions where the first connection terminals 3a are located to expose the first connection terminals 3a. Second vias 18 extending to the second connection terminals 3c are formed in the first planarization layer 16 at regions where the second connection terminals 3c are located to expose the second connection terminals 3c.

Figure 8:
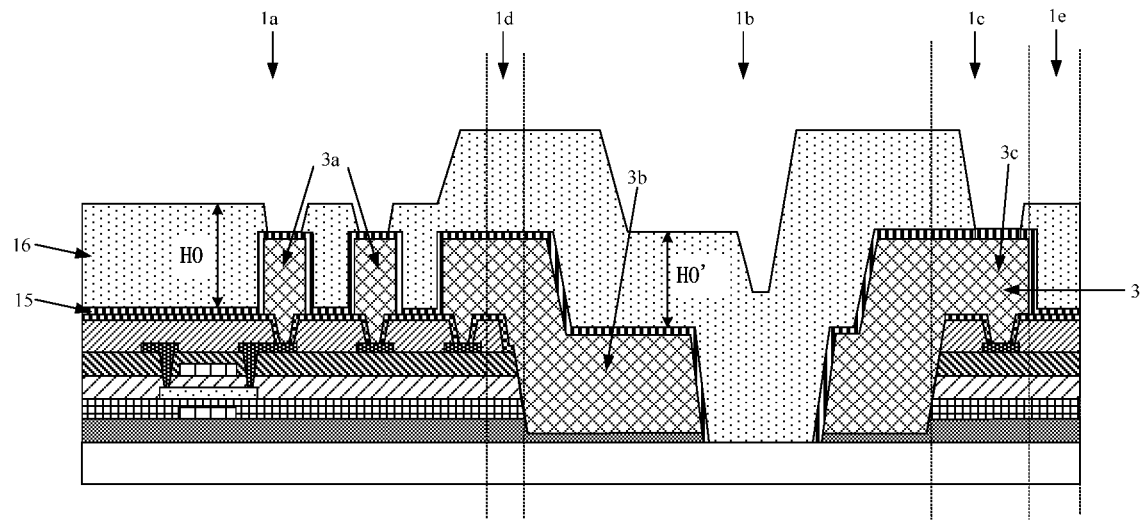
FIG. 8 is a schematic view illustrating a structure of a material film of a first planarization layer on a second passivation layer by a single coating process according to an embodiment of the present disclosure.

FIG. 8 is a schematic view illustrating a structure of a material film of a first planarization layer on a second passivation layer formed by a single coating process according to an embodiment of the present disclosure. As shown in FIG. 8, in practical production, due to high viscosity of the existing planarization material, after the planarization material is uniformly coated on a surface of the second passivation layer 15 by a coating process, the surface of the formed planarization material film has substantially a same topography as the surface of the second passivation layer 15. In this case, the planarization material film in the bendable region 1b above the signal supply lines 3b has a thickness H0' substantially equal to a thickness H0 of the planarization material film in the display region 1a.

Since the first planarization layer 16 needs a thickness greater than that of the first connection terminals 3a by 2 um~3 um in a die bonding process, when the conductive structures in the first conductive pattern layer 3 have a greater thickness, the planarization material film to be coated needs a greater thickness. The planarization material film above the signal supply lines 3b in the bendable region 1b has a greater thickness of H0', the overall thickness of the driving substrate in the bendable region where the signal supply lines 3b are located is greater in this case. A greater stress may be generated in the bending process, and the first planarization layer 16 is prone to tensile fracture.

In view of the above, in the embodiment of the present disclosure, when the first conductive pattern layer 3 (i.e., signal supply lines 3b) has a relatively small thickness (for example, the first conductive pattern layer 3 has a thickness equal to or less than 4 um), the planarization material film to be coated may have a small thickness. In this case, the planarization material film above the signal supply lines 3b has a relatively small thickness of H0', and the risk of tensile fracture of the first planarization layer 16 is relatively small. In this case, the above material film of the first planarization layer 16 may be formed by a single coating process.

Figure 9A:
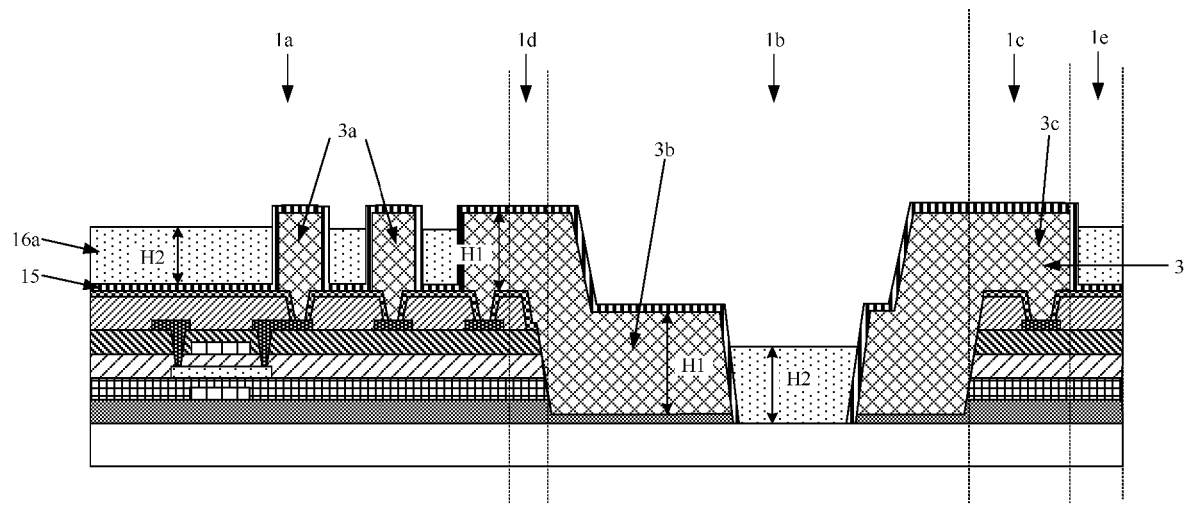
FIGS. 9a and 9b are schematic views illustrating a structure of a material film of a first planarization layer on a second passivation layer by two times coating process according to an embodiment of the present disclosure.
Figure 9B:
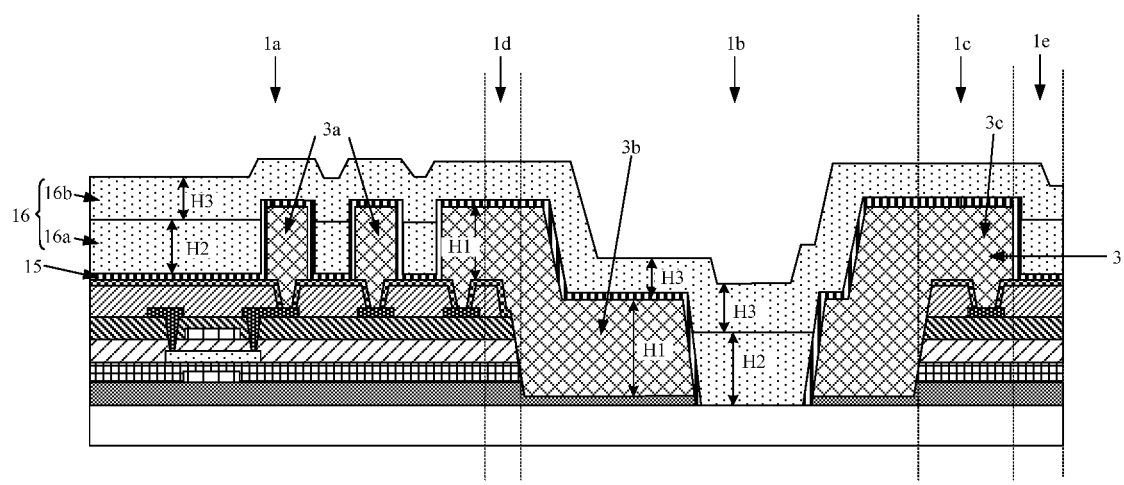

FIGS. 9a and 9b are schematic views illustrating a structure of a material film of a first planarization layer on a second passivation layer formed by two times coating process according to an embodiment of the present disclosure. As shown in FIGS. 9a and 9b, when the first conductive pattern layer 3 (i.e., signal supply lines 3b) has a relatively great thickness (for example, the first conductive pattern layer 3 has a thickness greater than 4 um), the material film of the first planarization layer 16 may need to be formed by two times coating process. In this case, the step S210 may include the following steps. Firstly, referring to FIG. 9a, a planarization material is coated on a side of the first conductive pattern layer 3 distal to the flexible substrate base 1 to form a first planarization material film 16a. The signal supply lines 3b have a thickness of H1, and the first planarization material film 16a has a maximum thickness of H2, H2≈H1. Then, the first planarization material film is etched to expose the plurality of signal supply lines. Then, referring to FIG. 9b, a planarization material is coated on a side of the first planarization material film 16a distal to the flexible substrate base 1 to form a second planarization material film 16b. The second planarization material film 16b has a maximum thickness of H3, H3+H2>H1, and the H3+H2 has a value larger than H1 by 2 um~3 um. The first planarization material film 16a and the second planarization material film 16b constitute a material film of the first planarization layer 16. Note that, when the material film of the first planarization layer 16 is formed by two times coating process, and H3+H2 is equal to H0 in FIG. 8, the thickness H3 of the planarization material film above the signal supply lines 3b is significantly smaller than H0' in FIG. 8.

Referring to FIG. 7j, a patterning process is performed on the material film of the first planarization layer 16 in FIG. 8 or FIG. 9b to form first and second vias 17 and 18 at positions corresponding to the first and second connection terminals 3a and 3c, respectively along the direction perpendicular to flexible substrate base.

In step S211, portions of the second passivation layer at bottoms of the first and second vias are removed.

Referring to FIGS. 2 and 3, the portions of the second passivation layer 15 at the bottoms of the first and second vias 17 and 18 are removed by a dry etching process to expose the first connection terminals 3a and the second connection terminals 3c.

Based on the above steps S201 to S211, the driving substrate shown in FIGS. 2 and 3 may be manufactured. Since the inorganic insulating layer formed by the thin film transistor manufacturing process includes a hollowed-out pattern in the bendable region, the inorganic insulating layer cannot cause the Young modulus of the driving substrate in the bendable region to be increased. The driving substrate can be bent normally at the bendable region, so that the coexistence of the thin film transistor manufacturing process and the substrate bending requirement is realized.

A display device is further provided according to an embodiment of the present disclosure. The display device may include: a plurality of light emitting elements and the above driving substrate. The light emitting elements are on a side distal to the flexible substrate base, and each of the light emitting elements has a first pin and a second pin. The first and second pins are coupled to corresponding first connecting terminals in the first conductive layer through the first vias in the first planarization layer.

The display device further includes a glass substrate base and a splicing enclosure. As shown in FIG. 4, the glass substrate base 21 is on a side of the flexible substrate base 1 distal to the plurality of thin film transistors, and the splicing enclosure 22 is on a side of the glass substrate base 21 distal to the flexible substrate base. A portion of the driving substrate 20 at the bendable region extends along a side surface of the glass substrate base 21 such that at least a sub-portion of the portion of the driving substrate 20 at the bendable region is between the glass substrate base 21 and the splicing enclosure 22. The splicing enclosure 22 is adhered to the driving substrate 20 by an adhesive in a partial region of the at least a sub-portion of the portion of the driving substrate at the bendable region. The region other than the partial region in the at least a sub-portion of driving substrate at the bendable region may be used as a redundancy region for other structures or elements of the display device. The redundancy region has a width in a range from 18 mm to 22 mm in the preset direction, for example, 20 mm.

When the first pin/the second pin are coupled to the first connecting terminal, an auxiliary structure (such as soldering tin, conductive adhesive and the like) may be adopted for more reliable electrical connection.

In some embodiments, the light emitting element includes: Micro-LED or Mini-LED. The first pin and the second pin of the light emitting element refer to a cathode and an anode of the Micro-LED/Mini-LED respectively.

In the embodiment, the light emitting elements and the driving substrate may constitute a light source with other optical structures (e.g., a light guide plate, a diffusion sheet, etc.) to provide light for a display panel in the display device. Alternatively, the light emitting elements and the driving substrate may be a part of a display panel in a display device to perform screen display directly.

In some embodiments, the display device may be any product or component having a display function, such as a mobile phone, a tablet computer, a television, a display, a notebook computer, a digital photo frame, a navigator, and the like.

It will be understood that the above embodiments are merely exemplary embodiments adopted to illustrate the principles of the present invention, and the present invention is not limited thereto. It will be apparent to those skilled in the art that various modifications and improvements can be made without departing from the spirit and scope of the invention, and such modifications and improvements are also considered to be within the scope of the invention.

What is claimed is:

1. A driving substrate, comprising:
a flexible substrate base, a plurality of thin film transistors on the flexible substrate base and a first conductive pattern layer on a side of the plurality of thin film transistors distal to the flexible substrate base; wherein
the flexible substrate base comprises: a display region, a bendable region and a bonding region, the bendable region is between the display region and the bonding region, and the plurality of thin film transistors are in the display region;
the first conductive pattern layer comprises: a plurality of first connection terminals and a plurality of signal supply lines, the plurality of first connection terminals are in the display region, a first number of first connection terminals of the plurality of first connection terminals are electrically coupled to first electrodes of the plurality of thin film transistors respectively, the plurality of signal supply lines are in the bendable region, two ends of each of the plurality of signal supply lines extend into the display region and the bonding region respectively, and the plurality of signal supply lines are electrically coupled to a second number of first connection terminals other than the first number of first connection terminals of the plurality of first connection terminals in the display region; and at least one inorganic insulating layer is between the first conductive pattern layer and the flexible substrate base, and the at least one inorganic insulating layer comprises a hollowed-out pattern in the bendable region.

2. The driving substrate of claim 1, wherein a portion of the at least one inorganic insulating layer in the bendable region has a thickness in a range from 0 Å to 2000 Å in a direction perpendicular to the flexible substrate base.

3. The driving substrate of claim 2, further comprising an isolation barrier layer between the flexible substrate base and the plurality of thin film transistors, wherein a portion of the isolation barrier layer in the display region has a thickness larger than a portion of the isolation barrier layer in the bendable region, and the at least one inorganic insulating layer comprises the isolation barrier layer.

4. The driving substrate of claim 3, wherein the portion of the isolation barrier layer in the display region has a thickness in a range from 6500 Å to 9500 Å;

a portion of the isolation barrier layer in the bendable region and overlappinged with the plurality of signal supply lines in the direction perpendicular to the flexible substrate base has a thickness in a range from 1000 Å to 2000 Å; and a portion of the isolation barrier layer in the bendable region and not overlappinged with the plurality of signal supply lines in the direction perpendicular to the flexible substrate base has a thickness of zero.

5. The driving substrate of claim 4, wherein the first conductive pattern layer further comprises: a plurality of second connection terminals in the bonding region, and the plurality of second connection terminals are electrically coupled to the plurality of signal supply lines, respectively.

6. The driving substrate of claim 5, further comprising a first planarization layer on a side of the first conductive pattern layer distal to the flexible substrate base; wherein a plurality of first vias respectively extending to the plurality of first connection terminals are provided in the first planarization layer at positions corresponding to the plurality of first connection terminals in the direction perpendicular to the flexible substrate base; and a plurality of second vias respectively extending to the plurality of second connection terminals are provided in the first planarization layer at positions corresponding to the plurality of second connection terminals in the direction perpendicular to the flexible substrate base.

7. The driving substrate of claim 6, wherein each of the plurality of thin film transistors comprises an active layer, a first gate, a corresponding first electrode of the first electrodes and a second electrode;

the driving substrate further comprises a gate insulating layer between the active layer and the first gate in the direction perpendicular to the flexible substrate base, and an interlayer dielectric layer between the first and second electrodes and the active layer, the first and second electrodes are coupled to the active layer through vias in the interlayer dielectric layer, respectively; and the at least one inorganic insulating layer comprises the isolation barrier layer, the gate insulating layer and the interlayer dielectric layer.

8. The driving substrate of claim 7, wherein each of the plurality of thin film transistors further comprises a second gate;

the second gate is on a side of the active layer proximal to the flexible substrate base, and a buffer layer is formed between the second gate and the active layer;

the first gate is on a side of the active layer distal to the flexible substrate base, the first and second electrodes are on a side of the first gate distal to the flexible substrate base, and the first gate is electrically coupled to the second gate; and the at least one inorganic insulating layer further comprises the buffer layer.

9. The driving substrate of claim 8, further comprising a second conductive pattern layer between the first conductive pattern layer and the plurality of thin film transistors; wherein the second conductive pattern layer comprises: a plurality of signal transmission lines, through which the second number of first connection terminals other than the first number of first connection terminals of the plurality of first connection terminals are electrically coupled to corresponding signal supply lines of the plurality of signal supply lines, respectively.

10. The driving substrate of claim 9, wherein the second conductive pattern layer is in a same layer as the first and second electrodes.

11. The driving substrate of claim 10, further comprising a second planarization layer on a side of the second conductive pattern layer distal to the flexible substrate base, and a first passivation layer on a side of the second planarization layer distal to the flexible substrate base, wherein the second planarization layer comprises a hollowed-out pattern in the bendable region;

the first conductive pattern layer is on a side of the first passivation layer distal to the flexible substrate base; and the at least one inorganic insulating layer further comprises the first passivation layer.

12. The driving substrate of claim 1, wherein the flexible substrate base further comprises an expanding region on a side of the bonding region distal to the display region;

the bendable region, the bonding region and the expanding region are sequentially arranged in a preset direction;

the bendable region has a width in a range from 15 mm to 25 mm in the preset direction;

the bonding region has a width in a range from 3.5 mm to 4.5 mm in the preset direction; and the expanding region has a width in a range from 4.5 mm to 5.5 mm in the preset direction.

13. A display device, comprising: a plurality of light emitting elements and the driving substrate of claim 1, wherein the plurality of light emitting elements are on a side of the first conductive pattern layer distal to the flexible substrate base;

each of the plurality of light emitting elements comprises a first pin and a second pin which are electrically coupled to corresponding first connection terminals of the plurality of first connection terminals, respectively.

14. The display device of claim 13, further comprising a glass substrate base and a splicing enclosure, wherein the glass substrate base is on a side of the flexible substrate base distal to the plurality of thin film transistors, and the splicing enclosure is on a side of the glass substrate base distal to the flexible substrate base.

15. The display device of claim 14, wherein a portion of the driving substrate at the bendable region extends along a side surface of the glass substrate base such that at least a sub-portion of the portion of the driving substrate in the bendable region is between the glass substrate base and the splicing enclosure, and the splicing enclosure is adhered to the driving substrate by an adhesive in a partial portion of the at least a sub-portion of the portion of the driving substrate in the bendable region.

16. A method of manufacturing the driving substrate of claim 1, comprising:
  providing the flexible substrate base, wherein the flexible substrate base comprises: the display region, the bendable region and the bonding region, and the bendable region is between the display region and the bonding region;
  forming the plurality of thin film transistors on the flexible substrate base, wherein the plurality of thin film transistors are in the display region; and
  forming the first conductive pattern layer on the side of the thin film transistors distal to the flexible substrate base, wherein the first conductive pattern layer comprises: the plurality of first connection terminals and the plurality of signal supply lines, the plurality of first connection terminals are in the display region, the first number of first connection terminals of the plurality of first connection terminals are electrically coupled to the first electrodes of the plurality of thin film transistors respectively, the plurality of signal supply lines are in the bendable region, the two ends of each of the plurality of signal supply lines extend into the display region and the bonding region respectively, and the plurality of signal supply lines are coupled to the second number of first connection terminals other than the first number of first connection terminals of the plurality of first connection terminals;
  the method further comprises forming the at least one inorganic insulating layer between the first conductive pattern layer and the flexible substrate base such that the at least one inorganic insulating layer comprises the hollowed-out pattern in the bendable region.

17. The method of claim 16, further comprising forming a first planarization layer on a side of the first conductive pattern layer distal to the flexible substrate base,
  wherein the forming the first planarization layer comprises:
  coating a planarization material on the side of the first conductive pattern layer distal to the flexible substrate base to form a first planarization material film, wherein the plurality of signal supply lines have a thickness of H1 in a direction perpendicular to the flexible substrate base, and the first planarization material film has a maximum thickness of H2, H2 is approximately equal to H1;
  performing an etching process on the first planarization material film to expose the plurality of signal supply lines;
  coating a planarization material on a side of the first planarization material film and the exposed plurality of signal supply lines distal to the flexible substrate base to form a second planarization material film; and
  forming a first number of first vias extending to the first number of first connecting terminals of the plurality of first connecting terminals in the second planarization material film by a patterning process.

18. The method of claim 16, wherein the forming the plurality of thin film transistors and the forming the at least one inorganic insulating layer comprises:
  sequentially forming first gates, a gate insulating layer, active layers and an interlayer dielectric layer on the flexible substrate base;
  forming the first electrodes, second electrodes and a second conductive pattern layer on a side of the interlayer dielectric layer distal to the flexible substrate base, wherein the second conductive pattern layer comprises: a plurality of signal transmission lines;
  forming a second planarization layer on a side of the first electrodes, the second electrodes and the second conductive pattern layer distal to the flexible substrate base, such that a first number of third vias and a second number of fourth vias are formed in the second planarization layer, wherein the first number of third vias respectively extend to the first number of first connection terminals of the plurality of first connecting terminals electrically coupled to the first electrodes of the plurality of thin film transistors respectively, the second number of fourth vias respectively extend to the plurality of signal transmission lines, and the second planarization layer comprises a hollowed-out pattern in the bendable region;
  forming a first passivation layer on the second planarization layer;
  removing portions of the first passivation layer, the interlayer dielectric layer and the gate insulating layer in the bendable region by an etching process; and
  removing portions of the first passivation layer at bottoms of the first number of third vias and the second number of fourth vias by an etching process.

* * * * *